(12) United States Patent
Tu et al.

(10) Patent No.: US 7,477,545 B2
(45) Date of Patent: Jan. 13, 2009

(54) SYSTEMS FOR PROGRAMMABLE CHIP ENABLE AND CHIP ADDRESS IN SEMICONDUCTOR MEMORY

(75) Inventors: Loc Tu, San Jose, CA (US); Jian Chen, San Jose, CA (US); Alex Mak, Los Altos Hills, CA (US); Tien-Chien Kuo, Sunnyvale, CA (US); Long Pham, San Ramon, CA (US)

(73) Assignee: SanDisk Corporation, Milpitas, CA (US)

( * ) Notice: Subject to any disclaimer, the term of this patent is extended or adjusted under 35 U.S.C. 154(b) by 38 days.

(21) Appl. No.: 11/763,292

(22) Filed: Jun. 14, 2007

(65) Prior Publication Data

US 2008/0310242 A1    Dec. 18, 2008

(51) Int. Cl.
    *G11C 16/04* (2006.01)
(52) U.S. Cl. .................. 365/185.05; 365/52; 365/63
(58) Field of Classification Search ............ 365/185.05, 365/51, 52, 63, 189.08, 185.23, 230.06
See application file for complete search history.

(56) References Cited

U.S. PATENT DOCUMENTS

| | | | |
|---|---|---|---|
| 5,430,859 A | 7/1995 | Norman et al. | |
| 5,502,667 A * | 3/1996 | Bertin et al. | 365/51 |
| 5,508,971 A | 4/1996 | Cernea et al. | |
| 5,581,498 A * | 12/1996 | Ludwig et al. | 365/63 |
| 5,627,838 A * | 5/1997 | Lin et al. | 714/718 |
| 5,987,623 A | 11/1999 | Ushida | |
| 6,148,363 A | 11/2000 | Lofgren et al. | |
| 6,282,130 B1 | 8/2001 | Cernea et al. | |
| 6,426,893 B1 | 7/2002 | Conley et al. | |
| 6,456,099 B1 | 9/2002 | Eldridge et al. | |
| 6,621,260 B2 | 9/2003 | Eldridge et al. | |
| 6,639,848 B2 | 10/2003 | Maejima | |
| 6,651,202 B1 | 11/2003 | Phan | |
| 6,862,700 B2 | 3/2005 | Zhu et al. | |
| 7,053,470 B1 | 5/2006 | Sellers et al. | |
| 7,054,705 B2 | 5/2006 | Ogawa et al. | |
| 7,114,659 B2 | 10/2006 | Harari et al. | |
| 7,149,871 B2 | 12/2006 | Conley | |
| 7,184,306 B2 | 2/2007 | Conley et al. | |
| 7,327,590 B2 * | 2/2008 | Matsui et al. | 365/51 |

(Continued)

OTHER PUBLICATIONS

U.S. Appl. No. 11/763,287 filed Jun. 14, 2007.

(Continued)

*Primary Examiner*—Gene N. Auduong
(74) *Attorney, Agent, or Firm*—Vierra Magen Marcus & DeNiro LLP

(57) ABSTRACT

Memory die are provided with programmable chip enable circuitry to allow particular memory die to be disabled after packaging and/or programmable chip address circuitry to allow particular memory die to be readdressed after being packaged. In a multi-chip memory package, a memory die that fails package-level testing can be disabled and isolated from the memory package by a programmable circuit that overrides the master chip enable signal received from the controller or host device. To provide a continuous address range, one or more of the non-defective memory die can be re-addressed using another programmable circuit that replaces the unique chip address provided by the pad bonding. Memory chips can also be also be readdressed after packaging independently of detecting a failed memory die.

17 Claims, 15 Drawing Sheets

U.S. PATENT DOCUMENTS

| | | | |
|---|---|---|---|
| 7,336,519 B2* | 2/2008 | Ishii | 365/63 |
| 7,402,897 B2* | 7/2008 | Leedy | 257/678 |
| 2003/0026136 A1 | 2/2003 | Maejima | |
| 2005/0278666 A1 | 12/2005 | Diamond | |
| 2006/0132167 A1 | 6/2006 | Chen | |

OTHER PUBLICATIONS

International Search Report & The Written Opinion of the International Searching Authority, Patent Cooperation Treaty, U.S. Appl. No. PCT/US2008/066111 filed on Jun. 6, 2008, Aug. 21, 2008.

* cited by examiner

| chip0 | chip1 | chip2 | chip3 | solution |
|---|---|---|---|---|
| good | good | good | good | good package, full capcity |
| good | good | good | bad | isolate chip2 and chip 3, ½ capcity |
| good | good | bad | good | isolate chip 2 and chip 3, ½ capacity |
| good | good | bad | bad | isolate chip 2 and chip 3, ½ capacity |
| good | bad | good | good | isolate chip1 and chip3, reconfigure chip2 to chip1, ½ capacity |
| good | bad | good | bad | isolate chip1 and chip3, reconfigure chip2 to chip1, ½ capacity |
| good | bad | bad | good | isolate chip1 and chip2, reconfigure chip3 to chip1, ½ capcity |
| good | bad | bad | bad | isolate chip1, chip2, chip3, ¼ capacity |
| bad | good | good | good | isolate chip0 and chip3, reconfigure chip2 to chip0, ½ capacity |
| bad | good | good | bad | isolate chip0 and chip3, reconfigure chip2 to chip0, ½ capacity |
| bad | good | bad | good | isolate chip0 and chip2, reconfigure chip3 to chip0, ½ capacity |
| bad | good | bad | bad | isolate chip0, chip2, chip3, reconfigure chip1 to chip0, ¼ capacity |
| bad | bad | good | good | isolate chip0 and chip1, reconfigure chip2 to chip0 and chip3 to chip1, 1/2 capacity |
| bad | bad | good | bad | isolate chip0, chip1, chip3, reconfigure chip2 to chip0, ¼ capacity |
| bad | bad | bad | good | isolate chip0, chip1, chip2, reconfigure chip3 to chip0, ¼ capacity |
| bad | bad | bad | bad | reject package |

Fig. 5

| package 1 | | | | | package 2 | | | |
|---|---|---|---|---|---|---|---|---|
| chip0 | chip1 | chip2 | chip3 | | chip0 | chip1 | chip2 | chip3 |
| good | good | good | bad | | bad | bad | bad | good |
| good | good | bad | good | + | bad | bad | good | bad |
| good | bad | good | good | | bad | good | bad | bad |
| bad | good | good | good | | good | bad | bad | bad |

Fig. 9

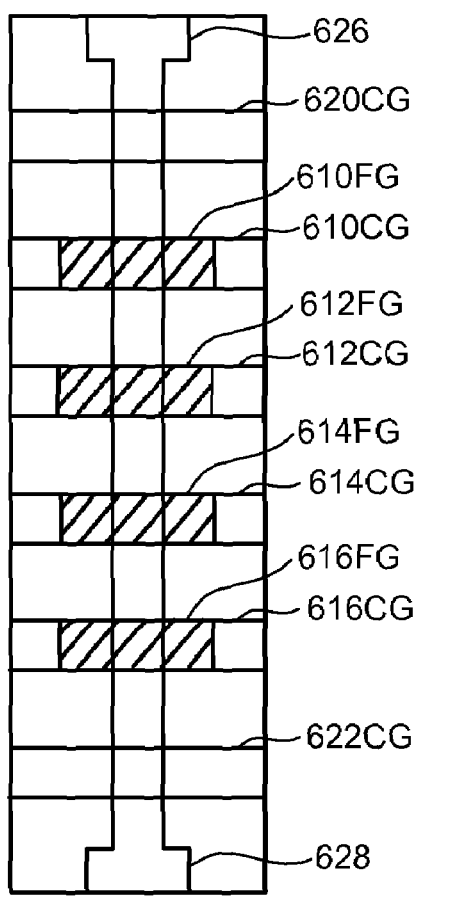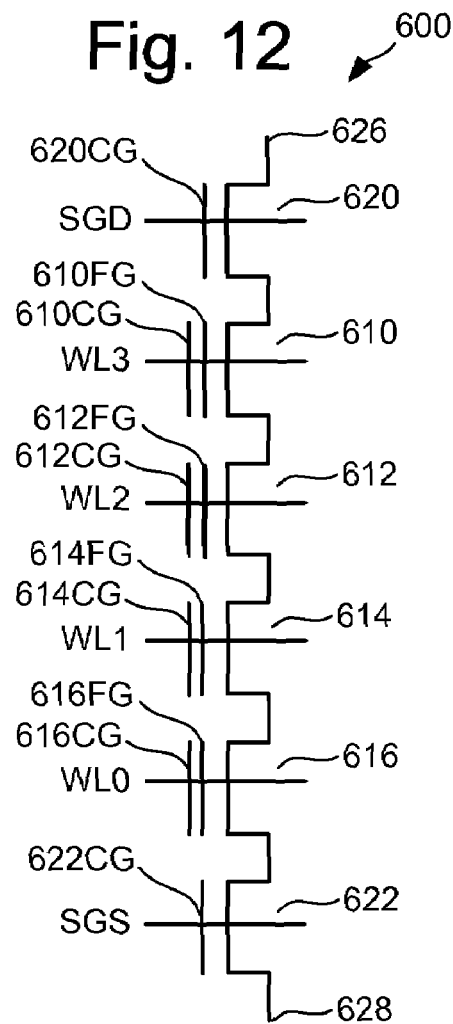

SYSTEMS FOR PROGRAMMABLE CHIP ENABLE AND CHIP ADDRESS IN SEMICONDUCTOR MEMORY

CROSS-REFERENCE TO RELATED APPLICATIONS

The following application is cross-referenced and incorporated by reference herein in its entirety:

U.S. patent application Ser. No. 11/763,287, entitled "Programmable Chip Enable and Chip Address in Semiconductor Memory," by Loc Tu, et al., filed concurrently.

BACKGROUND OF THE INVENTION

1. Field of the Invention

The present disclosure relates to technology for fabricating integrated circuits such as semiconductor-based memory devices.

2. Description of the Related Art

Semiconductor-based memory, including volatile memory such as dynamic or static random access memory and non-volatile memory such as flash memory have become more popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM), including flash EEPROM, and Electrically Programmable Read Only Memory (EPROM), are among the most popular non-volatile semiconductor memories.

As with most storage devices, semiconductor memory devices may have defective components or storage areas. For example, the individual storage elements or memory cells of a semiconductor memory array may be defective. Additionally, the peripheral circuitry for the memory array, including word lines, bit lines, decoders, etc., may be defective, rendering associated storage elements defective as well. It is inevitable in any commercially fabricated semiconductor memory device that some portion of the memory array will be defective.

Most defect management schemes rely on redundant memory cells to replace primary memory cells that are determined to be defective. During typical semiconductor memory fabrication processes such as that depicted in FIG. 1, wafer level testing 12 is conducted prior to packaging memory chips to form memory devices. A wafer can include hundreds or thousands of memory chips, each of which will include a memory array and peripheral components such as the control and logic circuits for accessing the memory cells of the array. During wafer level testing 12, the functionality of the memory chips is tested so that defective components are not needlessly integrated into a packaged device. Wafer level testing is often conducted at raised and/or lowered temperatures (e.g., 85° C. and/or –30° C.) to ensure functionality at extreme conditions and to ensure functionality after stressing the circuits. Memory cells that fail functionality testing can be replaced with redundant memory cells from the chip. Depending on the type of memory being manufactured, different redundancy schemes can be employed. For example, individual memory cells can be replaced, entire columns or bit lines of memory cells can be replaced, or entire blocks of memory cells can be replaced.

After wafer level testing 12, the wafer is divided into individual memory chips and one or more of the memory chips are packaged 14 to form a memory device. Packaged memory devices are then subjected to a burn-in process 16 to stress the memory arrays and peripheral circuitry of the chips. Burn-in is typically conducted under even higher temperatures (e.g., 125° C.) than wafer level testing. High voltages are applied at various portions of each chip to stress and identify weaker elements. The stress conditions of the burn-in process are designed to cause failure of weaker devices which can later be detected during package level testing 18. In some manufacturing processes, burn-in is not performed.

Package level testing usually consists of various functionality tests to determine which cells are defective subsequent to burn-in. In recent years, techniques such as anti-fuses have been incorporated into fabrication processes so that memory cells that are found to be defective subsequent to burn-in can be replaced by redundant memory from the memory chip.

In some instances, package level testing 18 results in the identification of entire memory chips that are defective. For instance, the number of defective memory cells of the array may exceed the redundancy capacity for the die or certain peripheral circuitry may fail, causing the die to be unusable. When this occurs, the entire memory package containing the defective die is generally unusable and rejected 20, resulting in yield losses for the manufacturing process. If the memory package contains multiple memory chips, the failure of a single die will result in a discarded package.

SUMMARY OF THE INVENTION

Memory die are provided with programmable chip enable circuitry to allow particular memory die to be isolated and disabled after packaging. In a multi-chip memory package, a memory die that fails package-level testing can be disabled and isolated from the memory package by a programmable circuit. Typically the chip enable pins of each memory die in a multi-chip package are tied together such that every chip is enabled in response to a master chip enable signal. The programmable chip enable circuitry can override the master chip enable signal received from the controller or host device. Programmable chip address circuitry is provided to allow particular memory die to be readdressed after being packaged. For instance, one or more non-defective memory die can be re-addressed using programmable circuitry that replaces the unique chip address provided by the pad bonding to provide a continuous address range. Memory chips can also be also be readdressed after packaging, independently of detecting a failed memory die.

In one embodiment, a method of manufacturing non-volatile memory includes packaging a plurality of non-volatile memory chips and a controller in a memory package, where the memory package includes a common chip enable line coupled to the controller and each of the non-volatile memory chips. The plurality of non-volatile memory chips are enabled in response to a chip enable signal provided on the common chip enable line. Testing is performed subsequent to packaging to determine whether any of the non-volatile memory chips are defective. If a memory chip is defective, it is isolated from being enabled in response to the chip enable signal.

A non-volatile memory system in one embodiment includes a multi-chip package with each chip having a plurality of non-volatile storage elements and one or more chip enable pins. The chip enable pin(s) of each memory chip is coupled to a common line. A controller is in communication with the common line and a selection a selection circuit on each memory chip is responsive to a chip enable signal provided by the controller. Each selection circuit enables its corresponding memory chip in response to the chip enable signal. A set of one or more programmable circuits on each chip is in communication with a chip enable pin and a selection circuit of the chip. The set of programmable circuits is configurable after packaging the non-volatile memory system to isolate a corresponding memory chip from being enabled in response to the chip enable signal.

Each memory chip can further include a set of one or more device select pins and one or more additional programmable circuits. The device select pins are coupled to a set of one or more pads and the additional programmable circuits are coupled between the device select pins and the selection circuit. A unique address for each of the memory chips is defined using a predetermined configuration for the set of pads as part of packaging. The selection circuit for each memory chip will compare an address received from the controller to the unique address received on the set of device select pins to determine whether the memory chip is to be selected. The unique address of a memory chip can be replaced with a different address by configuring the additional programmable circuits to provide the different address to the selection circuit of the chip in place of the address received from said the set of pads.

BRIEF DESCRIPTION OF THE DRAWINGS

FIG. 5 is a table describing an exemplary technique for readdressing packaged memory die.

FIG. 9 is a table describing an exemplary technique for readdressing memory die from multiple packages to form a package from the memory die of each smaller package.

FIG. 11 is a top view of NAND string.

FIG. 12 is an equivalent circuitry diagram of the NAND string of FIG. 11.

DETAILED DESCRIPTION

Figure 2:
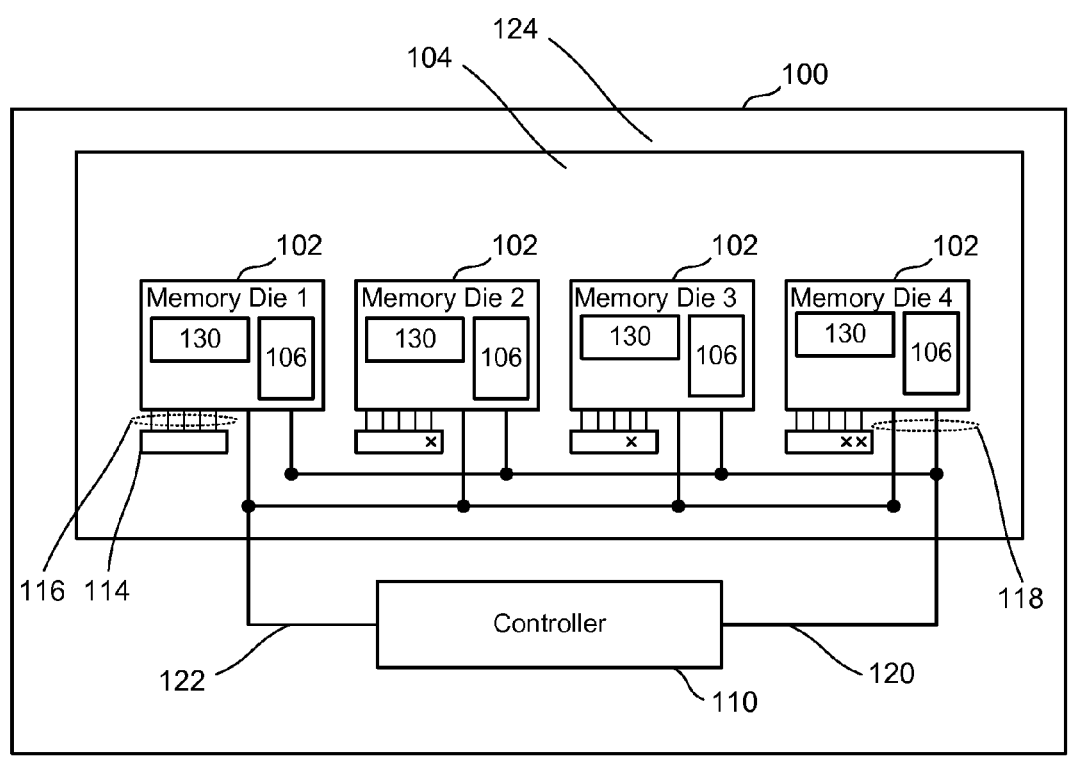
FIG. 2 is a block diagram of an exemplary memory package.

FIG. 2 schematically illustrates a non-volatile memory system 100 having a number of individual memory die 102 and a controller 110. Each memory die is an integrated circuit memory chip or die mounted on a substrate or printed circuit board 104. The controller 110 is also an integrated circuit chip or die mounted on its own printed circuit board 124. The two printed circuit boards can be mounted to a third printed circuit board (not illustrated). In other implementations, the controller and memory die may be mounted on the same board.

Each memory device includes a non-volatile memory array 106 formed of individual non-volatile memory cells. The memory array can include, but is not limited to, flash memory cells arranged using architectures such as the NAND and NOR architectures. The memory die 102 each include peripheral circuitry for addressing and controlling their respective memory array. The controller 110 is included in the memory system to control memory operations between a host device and the individual memory die 102. The controller is capable of independently addressing each memory die of the system. It is not necessary that a controller be included in the memory system. For instance, some implementations may have the controller functionality handled by the host device, such as by a processor of a standard processor-based computing system. Furthermore, multiple memory die 102 may be packaged in a single package without a controller and be subsequently combined with other packages and a controller to form the memory system.

Each memory die 102 includes two sets of external pinouts or pins. A first group of pinouts 116 for each die is a group of device select pins. The device select pins provide the memory device with a unique chip address for the packaged memory system. The device select pins of each die are connected to a set of bonding pads 114 for that die. In this particular configuration, each memory die 102 has five device select pinouts 116 that are connected to five corresponding pads 114. By selectively grounding particular pads for a memory die, the memory die is configured or keyed with an address. A predetermined grounding configuration for the pads can be provided for an individual memory die to assign it a unique chip address within the package. Substrate 104 can include mounts with predetermined pad configurations. When the die are mounted to the substrate, they are thereby assigned the corresponding chip address. Each memory die will determine its address from the configuration applied to the pads. The device select pins provide the grounding configuration of the pads to the selection circuitry within the device. When the device is enabled, the selection circuitry compares addresses provided by the controller 110 with the grounding configuration to determine whether it should select and process a request.

In FIG. 2, memory device 1 is assigned the address '11' assuming ground represents logical '0' and an 'x' in the figure depicts a grounded pad. Memory device 2 is assigned address "10," memory device 3 is assigned address "01," and memory device 4 is assigned address "00." Only two pads are required for addressing the four individual memory die as depicted in FIG. 2, although a total of five device select pins and grounding pads for each die are shown.

The second set of pinouts 118 are device bus pinouts for connecting each memory die to the common device bus 120. The device bus 120 is connected to controller 110 at a first end and each of the individual memory die 202 at the other. The number of device bus pinouts 118 will vary according to implementation, particularly the requirements of the corresponding bus in the system. Each memory die is connected to the common bus to receive and respond to various control and address commands issued by controller 110. Control line 122 is depicted apart from device bus 120, although in various embodiments, it may be regarded as part of the device bus 120. Control line 122 is a master chip enable line. Each memory device is generally enabled in response to a master chip enable signal provided by controller 110. In response to this chip enable signal, each device enables a set of input registers within the device. A chip or array address is passed from the controller on the device bus 120 and shifted into the registers at each device while enabled. The selection circuitry 130 in each device compares the received array address with the unique address provided by the predetermined configuration of grounding for the set of pads 114 to determine if the memory device is to be selected. If so, the control circuitry for the memory die will process the request by reading data from or writing data to the array.

As previously described, certain defects detected after packaging the memory die to form a package such as that depicted in FIG. 2 can result in a failure of the entire memory package. The device bus pinouts 118 of each memory die are tied together internally within the package. For example, the pinouts may each be connected to a common bonding pad. Once the die have been packaged together, it is not possible to physically alter the internal wiring to disconnect a bad die. Additionally, the pad bonding 114 for each memory die is fixed as of the time of packaging. The predetermined configuration of the pads is applied and the memory die connected via the device select pins as part of the packaging process. Once the die are packaged, the configuration for the fixed pad bonding cannot be altered. Thus, when a single die fails package level testing, the package fails and is usually rejected. Because the chip enable and device select pins are fixed before detecting the failure of the die, the die cannot be disabled or mapped out of the address range for the device. The package is unusable even if a single die is all that has failed.

A programmable chip enable and programmable chip address are provided for individual memory die within a non-volatile memory system to overcome such deficiencies. Failing die in multi-chip configurations are isolated when their failure is detected after packaging. Where the failing die interrupts a continuous address range for the memory system, other die within the package can be re-addressed via the programmable chip address to provide a continuous address range in spite of the failed die.

Figure 3:
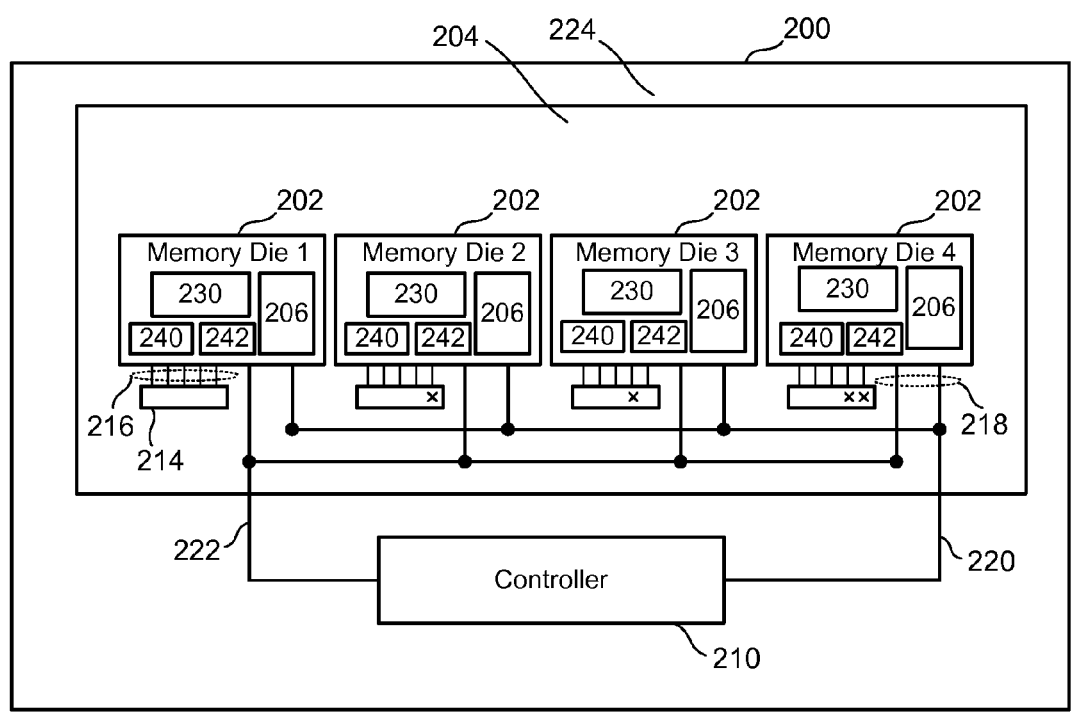
FIG. 3 is a block diagram of a memory package in accordance with one embodiment.

FIG. 3 illustrates schematically a non-volatile memory system 200 according to an embodiment of the present disclosure. The system 200 of FIG. 3 contains many of the same components as that of FIG. 2. A number of memory devices 202 are provided in a package with a controller 210. Each memory device 202 includes a first group of pins 216 connected to a corresponding set of bonding pads 214 for the die. The second set of pins or pinouts 218 are device bus pinouts for connecting each memory die to the common device bus 220. As before, each memory die is connected to the control line 222, which may regarded as part of the device bus 220, via their chip enable pin.

The control circuitry of each memory die in FIG. 3 includes a first programmable circuit 240 to replace or reprogram the unique address provided by the set of grounding pads and a second programmable circuit 242 to isolate the memory die from the master chip enable signal provided on the control line 222. Although circuits 240 and 242 are depicted apart from the corresponding selection circuitry 230 of each memory die, these circuits could be included as part of the selection circuitry. The programmable circuits each include one or more fuses or other suitable programmable circuitry to reprogram the chip enable signal and/or unique array address for the corresponding memory die.

Numerous types of programmable circuits can be used in order to store the data necessary for reprogramming the chip enable signal and/or unique address for a particular memory die. In general, some type of fuse circuitry is provided to store logic data used in programming the chip enable signal and/or chip address for the die. Because the fuse circuitry is programmed subsequent to device packaging, it should be writable in its packaged state. Anti-fuses provide a convenient means for storing logic data and are used in one embodiment. Anti-fuses have a first logical state corresponding to high resistance and a second logical state corresponding to low resistance, as opposed to the initial low resistance state of a standard fuse. In some instances, anti-fuses are written or blown using laser annealing processes or electrical processes to place the device into its lower resistance state corresponding to the second or programmed logic state. These types of anti-fuses may not be suitable for post-packaging programming as often they require direct access to the fuse and can only be incorporated into wafer level testing.

ROM fuses are especially suited for post-packaging programming as they are capable of being written to after molding and packaging processes. ROM fuses include an anti-fuse element in one of two logic states including an unprogrammed, high-resistance state or a programmed, low-resistance state. An unprogrammed anti-fuse link in a ROM array or register may have a resistance on the order of a gigaohm, and a programmed anti-fuse link may have a resistance on the order of a few hundred ohms. For programming a typical anti-fuse, a high voltage signal is applied to transfer the link from its initial high-resistance state to its programmed, low-resistance state. This serves to store a single bit of logic data. Other electrically programmable fuses may be utilized that are subject to post-packaging programming. For instance, some electrically programmable fuses utilize traditionally programmable nonvolatile memory elements to store data in logic states. Usually, electrically programmable fuses can be accessed and programmed both before after device packaging. In one embodiment that uses programmable fuses, a portion of the main array of memory cells for the memory die can be used.

Programmable chip enable circuit 242 can have a fuse or anti-fuse in an initial state that causes the chip enable signal to pass directly to the selection circuitry of the memory die. In this state the memory die operates as usual, receiving the master chip enable signal from the controller (or host device) on its chip enable pin. A second value can be set into the fuse after packaging the device to cause the chip enable signal to essentially be overridden for that particular memory die. A ROM anti-fuse (often just referred to as a ROM fuse) may be set to its low-resistance state causing an alternate signal to be provided in place of the chip enable signal provided on the device bus.

Assume that each memory die 202 is operable to be enabled by its selection circuitry in response to a low voltage or ground on the chip enable line. As illustrated in FIG. 3, the programmable chip enable circuitry is provided between the chip enable pin and selection circuitry. When the programmable circuitry is set to a second value, a high voltage can be driven at the input of the selection circuitry in place of the chip enable signal. Accordingly, the chip will not be enabled in response to the chip enable signal provided by the controller or host.

One or more fuses for programmable chip address circuitry 240 can store and provide an alternate unique address for its corresponding memory die. In FIG. 3, each unique chip address is comprised of two bits to individually address the four memory die such that two fuses can be used to assign an alternate address. A third fuse can be used to store a value indicating whether the address provided by the fuses should be used in place of the standard address from the pad bonding. For instance, a memory die chip address can be reprogrammed by programming the third fuse to cause the chip address circuitry to be activated for replacing the chip address. In response to the third fuse being set to its programmed state, the logic values stored by the first two fuses can be provided to the selection circuitry in place of the unique address provided on the device select pins from the pad bonding. A fuse in its initial state can correspond to a logic '0' for example, and a fuse in its programmed state can correspond to logic '1.' If the third fuse is set, the values from the first two fuses are supplied as the input to the selection circuitry in place of the pad bonded address.

Figure 4:
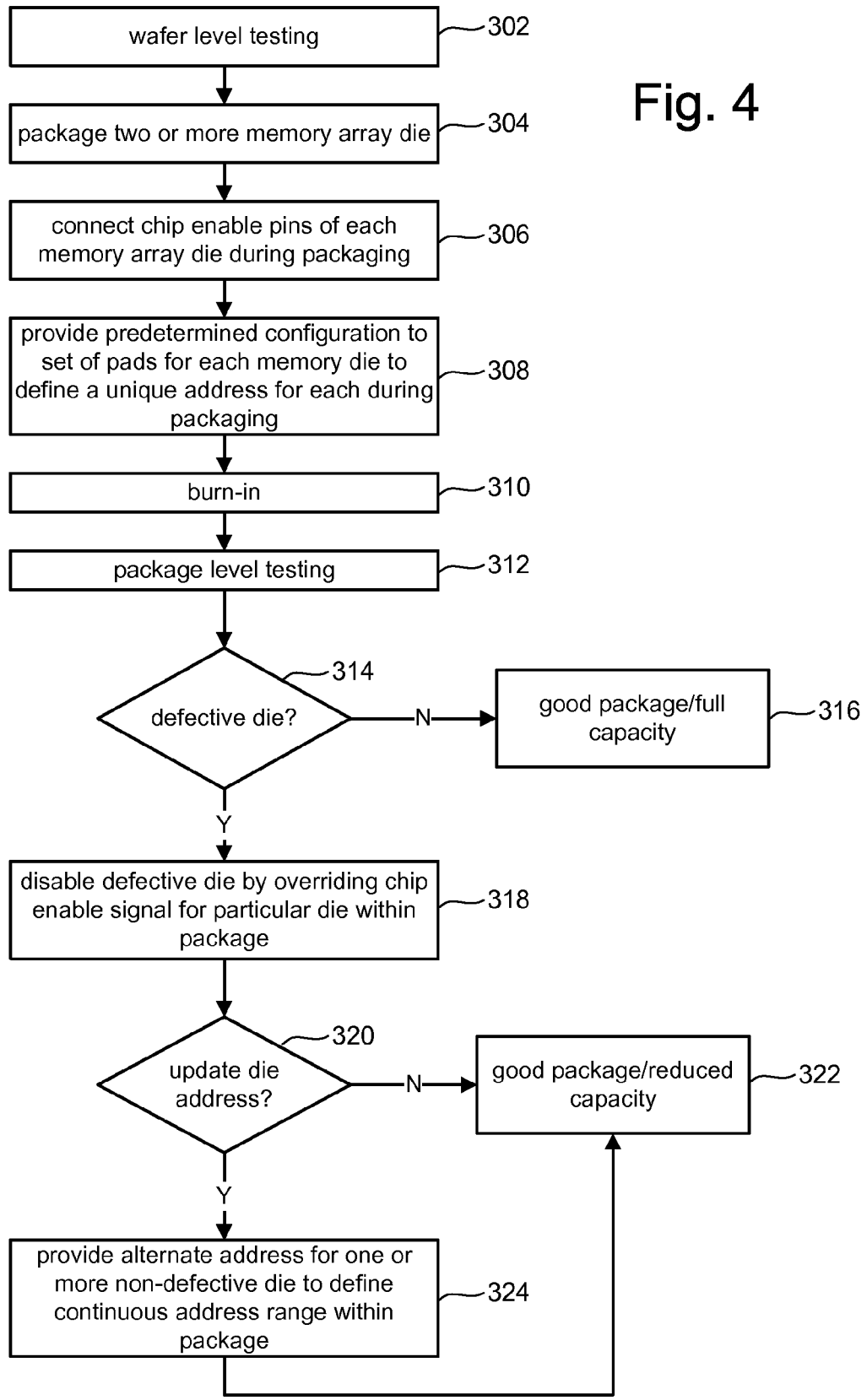
FIG. 4 is a flowchart describing a method of manufacturing semiconductor memory according to one embodiment.

A process of manufacturing non-volatile semiconductor memory devices is illustrated in FIG. 4, whereby a programmable chip enable and/or programmable chip address are utilized. Wafer level testing is performed at step 302 for a group of semiconductor wafers, each typically having a number of undivided memory array die which include the memory array and peripheral circuitry for controlling the memory array. After wafer level testing, the individual memory die of the wafers are divided and packaged at step 304. Single chip packages, multi-chip packages, both with and without controller chips can be packaged at step 304. A large variety of packaging configurations can be used. The die are typically mounted on a substrate with a conductive layer etched on one or both sides. Electrical connections are formed between the die and conductive layers(s), with the conductive layer(s) providing an electric lead structure for integration of the die into an electronic system.

As part of forming electrical connections between the die and conductive layer(s), the chip enable pins of each memory array are connected to a master chip enable line or to a common bus at step 306 to receive a chip enable signal from the controller or host device. At step 308, a predetermined configuration is applied to the set of bond pads for the device select pins of each chip, thereby assigning each chip its own unique chip address. Selected pins may be configured to grounded pads to define an address as illustrated in the example of FIG. 3. Some die are provided with bond pads on the die that can be connected to electrical leads of a leadframe, for example, to define the unique chip address. Once the electrical connections between the die and substrate are made, the assembly is typically encased in a molding compound to provide a protective package.

Figure 1:
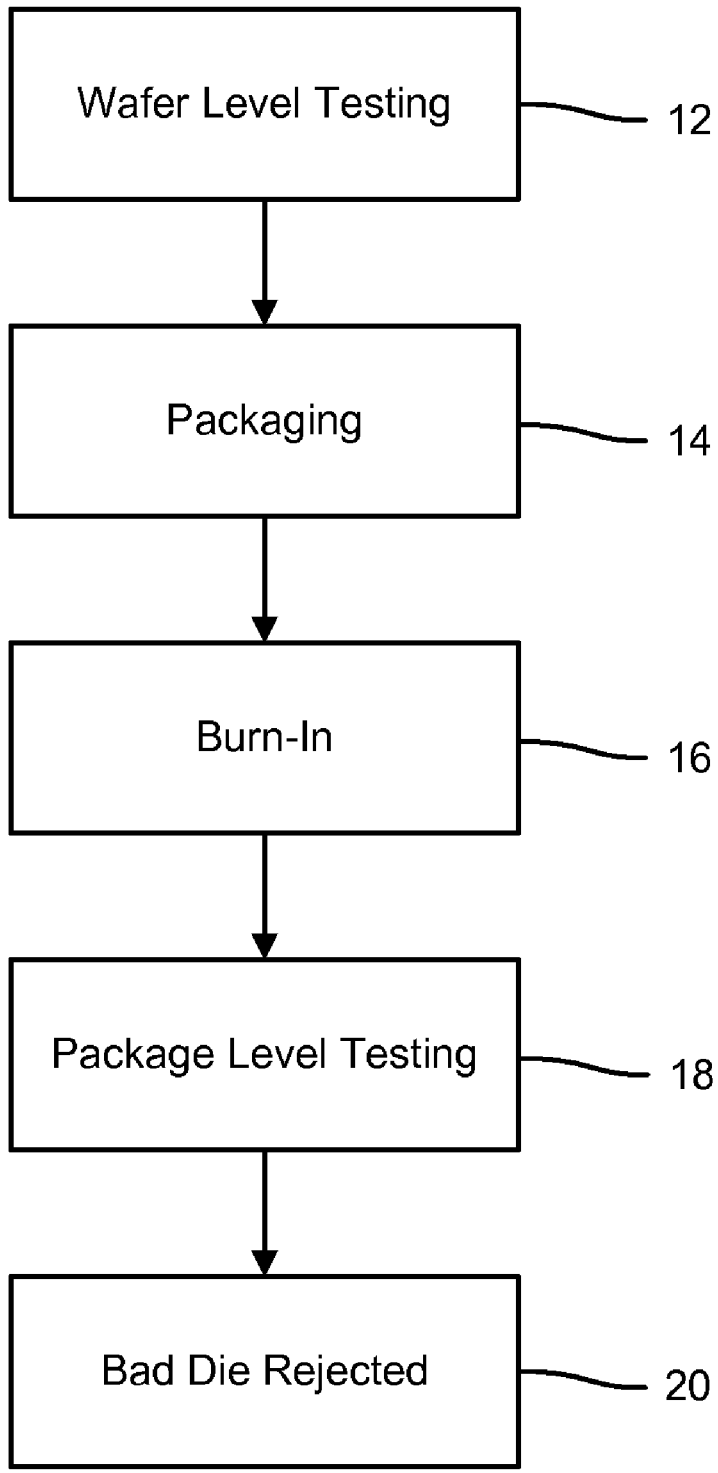
FIG. 1 is a flowchart describing a method of manufacturing memory according to the prior art.

An optional burn-in process as previously described for FIG. 1 can be performed at step 310 to stress the package, including the memory array(s), peripheral circuitry, controller, etc. After burn-in, testing is performed on the package at step 312. Numerous types of package-level tests can be applied, including by way of example, bit and word line tests to detect faults, shorts, etc., memory cell tests for reading, writing, and data retention, peripheral circuitry tests, etc. In some embodiments, redundant memory cells are used at step 312 after packaging to replace defective memory cells, individually or by blocks or columns, etc. of individual memory die.

If no die are determined to be defective, the process is complete and the packaged device is delivered at step 316 with full capacity. If one or more memory die are defective, they can be isolated from the other memory die in the package at step 318. Step 314 can include determining if the number of defective die is manageable in one embodiment and only proceed to step 318 if the number of die can be handled by the programmable circuitry. If all the die or more than another predetermined number have failed, the package can be discarded.

Step 318 disables the defective die as previously described in one embodiment. Programmable circuitry on the memory die can override the chip enable signal provided to the die on the common device bus for the package. A ROM fuse, for example, can be programmed to a logic state designating that the die be disabled. In response, the circuitry can provide an alternate bias at the chip enable input (e.g., the chip enable pin) that overrides the chip enable signal. If the chip enable signal goes low to enable a device, the programmable circuitry can output a high voltage on the chip enable line that is internal to the die to disable the die at all times.

At step 320, it is determined whether one or more of the non-defective memory die of the chip are to be re-addressed. In some cases, the defective die is simply disabled and the memory package is provided with a corresponding reduced capacity. In other instances as are more fully described hereinafter, one or more of the non-defective memory die are re-addressed to provide a non-defective continuous address range for the memory package. For instance, if the second of a four chip memory package is disabled, chip 0 can be re-addressed with the address of chip 1 to provide a continuous address range with chips 2 and 3. If one or more die are to be re-addressed, the alternate address for the die is provided using programmable circuitry to replace the unique address provided by the pad bonding.

FIG. 5 is a table illustrating an exemplary scheme for re-addressing memory die in a four chip package. The illustrated scheme is but one example for reconfiguring the chip addresses for the memory die. In the provided example, a three chip package is not provided so at least two die are disabled even if only a single die is defective. This may be done, for example, to provide a standard sized memory package. In another example, only the single defective die is disabled and a three chip package can be provided.

If all the chips are good, no readdressing is required and the full capacity package is deliverable. If chip 3 is bad, chips 2 and 3 are isolated and the package is provided with half capacity. No chips are re-addressed as chips 0 and 1 provide a continuous address range. If chip 2 is bad, chips 2 and 3 are again isolated and no chips readdressed. If chip 1 is bad, chips 1 and 3 are isolated and chip 2 is reprogrammed with the chip address for chip 1. This provides a continuous address range corresponding to the original addresses for chips 0 and 1. If chips 1 and 3 are bad, they are isolated and chip 2 is reprogrammed with the chip address for chip 1. If chips 1 and 2 are bad, they are isolated and chip 3 is reprogrammed with the address of chip 1. If chips 1, 2, and 3 are bad, they are disabled and chip 0 retains its original address. If chip 0 is bad or if chips 0 and 3 are bad, chips 0 and 3 are disabled and chip 2 is programmed with the address of chip 0. If chips 0 and 2 are bad, they are disabled and chip 3 is programmed with the address of chip 0. If chips 0, 2 and 3 are bad, they are disabled and chip 1 is programmed with the address of chip 0. If chips 0 and 1 are bad, they are disabled and chip 2 is programmed with the address of chip 0. If chips 0, 1, and 3 are bad, they are disabled and chip 2 is programmed with the address of chip 0. If chips 0, 1, and 2 are bad, they are isolated and chip 3 is programmed with the address of chip 0. If all the chips are bad, the package is rejected.

Figure 6:
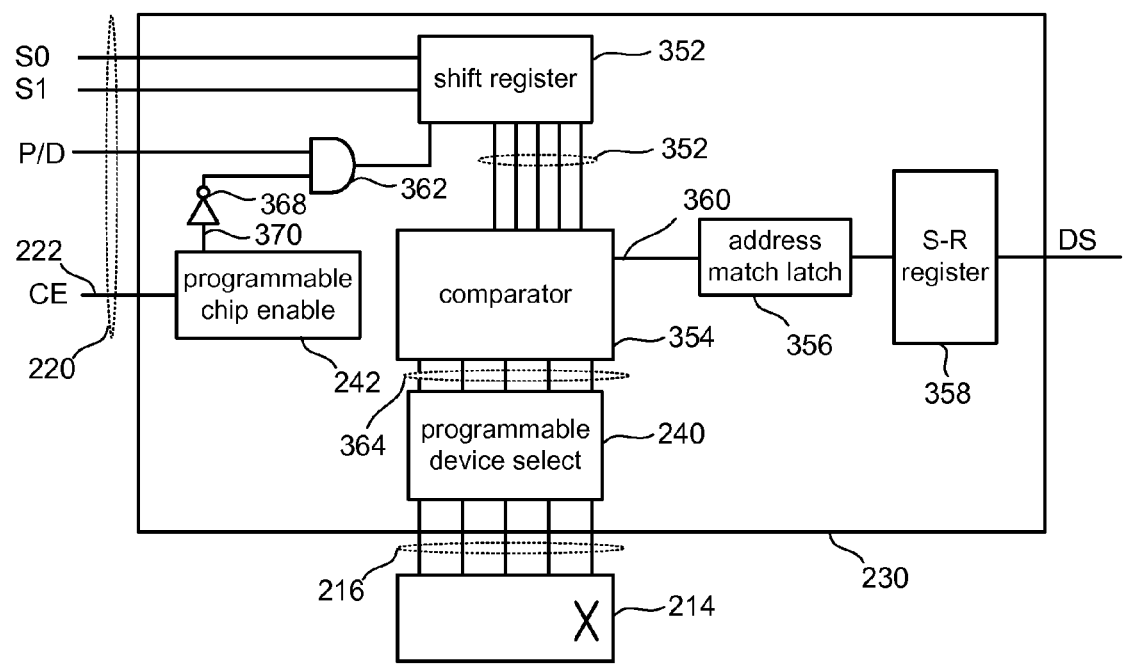
FIG. 6 is a block diagram of selection circuitry for a memory die in accordance with one embodiment.

FIG. 6 schematically illustrates selection circuitry 230 in one embodiment. In FIG. 6, the programmable circuitry is depicted as part of selection circuitry 230 although it need not be in all implementations. The selection circuitry generally includes a shift register 352, comparator 354, address match latch 356, and S-R register 358. The selection circuitry has inputs from the device select pins 216 and the device bus 220, including the chip enable line 222. The selection circuitry has an output DS to select or deselect the device (memory die) it is controlling.

Comparator 354 and address match latch 356 implement address matching for the memory die. In the example of FIG. 6, a two-bit address is shifted into shift register 352 from the serial lines S0 and S1 of device bus 220. A clocking signal is carried on control line P/D which is gate-enabled by a LOW signal on the master chip enable line 222 which is inverted by inverter 368. Master chip enable line 222 is shown as part of device bus 220 in FIG. 6. The two-bit unique chip address is then passed from the shift register 352 to the comparator 354.

With the programmable chip address circuitry in its initial state, the comparator receives the unique chip address obtained from the device select pinouts 216 as a second input. As earlier described, the address for each location within the array is defined by the grounding configuration or "key" of the bonding pads 214. By virtue of the memory die connecting to a particular mount on the board, for example, the address defined by the pads of the mount are passed onto the memory device via the device select pinouts.

The comparator compares the address received on the serial lines S0 and S1 with that obtained on the device select pins. If the addresses match, the comparator output 360 goes HIGH. This output is clocked into the address-match register 356 by the falling edge of the of the chip enable signal on the chip enable line CE 222 (connection not shown). This results in an S-R register 358 being set HIGH such that the output DS is also high and the device is selected. When the addresses do not match, DS will be LOW and the device is not selected.

Programmable chip enable circuitry 242 is utilized to isolate a particular memory die from the package. This is accomplished by isolating the die from the master chip enable line to disable the memory die so that it remains unselected. The programmable chip enable circuitry can be programmed after packaging to disable the corresponding memory die. In its initial state, the programmable chip enable circuitry will simply pass the chip enable signal received via master chip enable line 222 directly to inverter 368 to control gate 362. The selection circuitry operates in its normal mode so that the chip enable signal enables clocking signal P/D to shift the address on the serial lines S0 and S1 into the shift register 352.

If the programmable circuitry is set to a second state, the corresponding memory die is isolated from the chip enable line 222. Gate 362 is enabled by the master chip enable signal going LOW. Accordingly, the programmable circuitry can drive a HIGH signal on line 370 in place of the chip enable signal that would normally be passed thereon. In this manner, regardless of the chip enable signal provided by the host or controller on the chip enable line, the gate will remain off and the clocking signal will not enable the shift register 352 to receive the unique chip address on the serial lines S0 and S1. By disabling the input shift register 352, the corresponding memory die is disabled, and will remain so, independently of the chip enable signal.

Programmable device select circuitry 240 is utilized to reprogram the unique chip address for a particular memory die in the package. The device select input pins are connected to the programmable device select circuitry, which will pass the signals thereon directly to comparator 240 when the programmable circuitry is in its initial operating state. A first fuse can store a single bit to indicate that the chip address received on the device select pins is to be overridden. When this bit is asserted, the programmable device select circuitry provides a different unique address to comparator 354, thus overriding the chip address provided by the physical bonding. A number of fuses corresponding to the number of bits in the unique chip address are used to provide the different address. For instance, the initial resistance state of the fuse may correspond to logic '0' and the programmed low-resistance state may correspond to logic '1,' or vice-versa. The address fuses can be selectively conditioned to store the new chip address. The programmable circuitry will then provide this address on bus 364 to the comparator. As such, the memory die has been reprogrammed with a new unique chip address after packaging.

Figure 7:
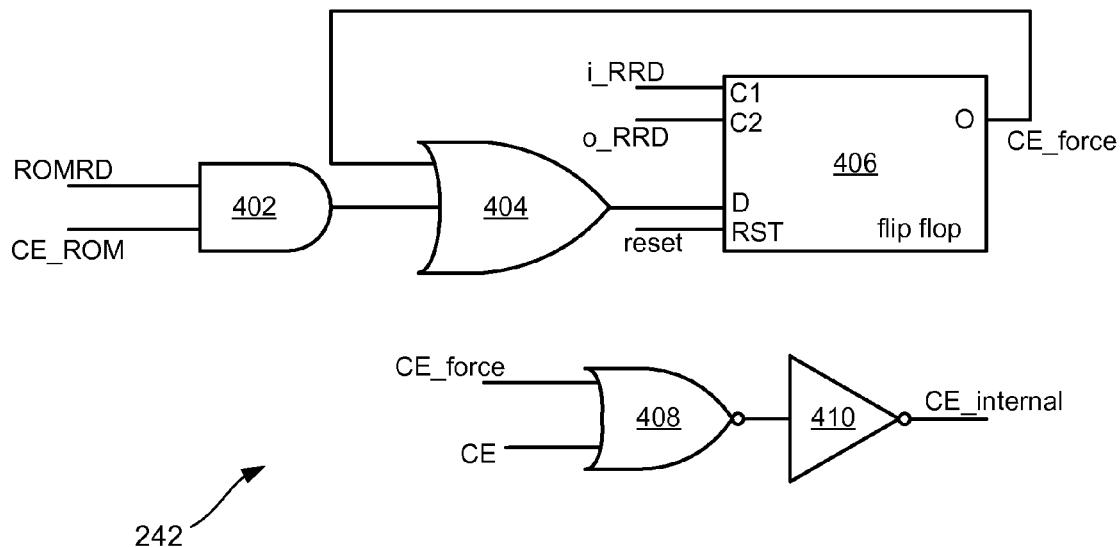
FIG. 7 is a circuit diagram of a portion of programmable chip enable circuitry of one embodiment.

FIG. 7 is a schematic illustration of a programmable chip enable circuit 242 in accordance with one embodiment. A ROMRD timing signal is provided as a first input to gate 402. A data signal from a ROM fuse is provided as a second input. The data signal carries a signal for a single bit of data from a ROM fuse for the circuitry. If the ROM fuse is in its initial state, the gate is not enabled in response to the timing signal. In various embodiments, the timing signal can be asserted at power up or power down, for example, to cause the data from the ROM fuse to be read. If the gate is not enabled by a programmed fuse, the gate output remains LOW and the output CE_force remains LOW. As such, the master chip enable signal is passed to the selection circuitry as described in FIG. 6.

If the ROM fuse is programmed, CE_ROM will be high when the ROMRD timing signal is issued and the output of gate 402 goes HIGH. The output of OR gate 404 goes HIGH when the output of gate 402 goes high. The HIGH value from the output of the OR gate is sampled by the flip flop 406, in response to timing signals i_RRD and o_RRD. The sampled HIGH value is then provided as output CE_force.

The output CE_force is provided to NOR gate 408 with a sampled value of the chip enable signal from the chip enable pin. An input buffer (not illustrated) can be used for the sampled value. If CE_force goes HIGH by programming the ROM fuse, the output of NOR gate 408 is LOW. The output is inverted by inverter 410 and provided as an internal chip enable signal CE_internal. The HIGH CE_internal output will be provided to inverter 368 which provides a LOW output to gate 362 (FIG. 6). Thus, the shift register 352 is disabled, resulting in a disabled memory die.

Figure 8:
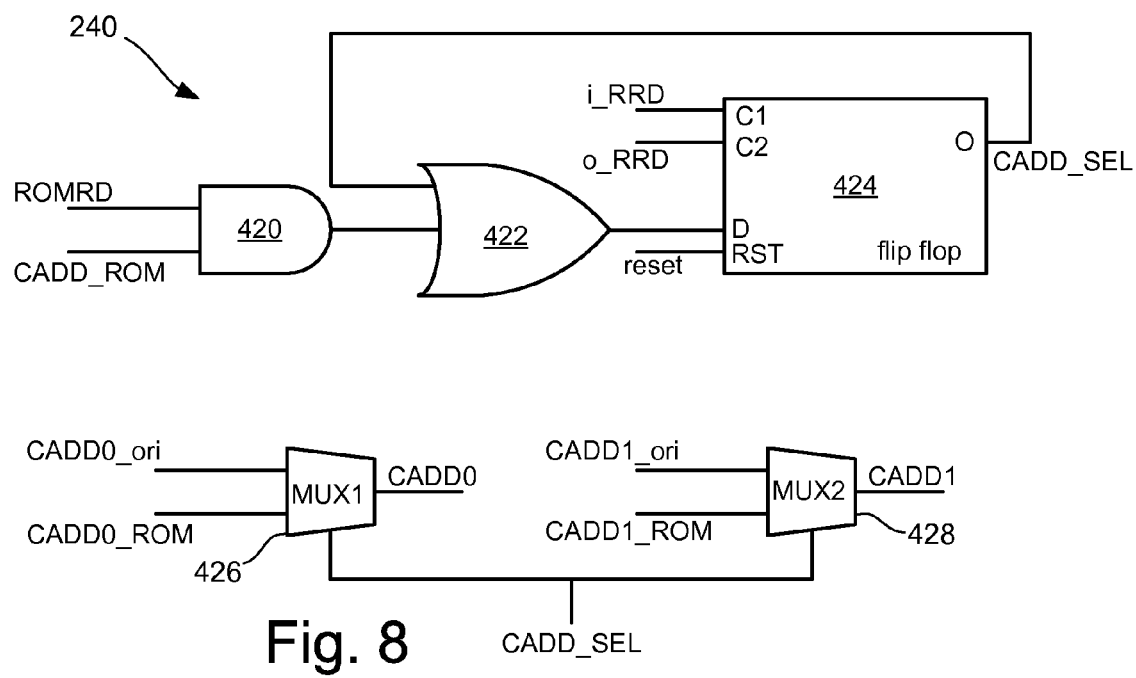
FIG. 8 is a circuitry diagram of a portion of programmable chip address circuitry of one embodiment.

FIG. 8 is a schematic illustration of programmable device select circuitry 240 in one embodiment. A ROMRD timing signal and the output of a first ROM fuse (referred to as a selection fuse) are provided to gate 420. When the timing signal ROMRD goes HIGH, the data from the ROM fuse is provided to the gate. If the fuse is not programmed, the gate output remains low and the output of flip flop 424 is low. If the fuse is programmed, the output of gate 420 goes HIGH and the OR gate output 422 goes HIGH. The output CADD_SEL of flip flop 424 then goes HIGH in response to timing signals i_RRD and O_RRD.

The lower portion of the circuitry in FIG. 8 is used to select either the original chip address provided by the pad bonding or the programmed address provided by the programmable circuitry. A first multiplexer MUX1 426 receives two inputs, CADD0_ori and CADD0_ROM for the first bit of the chip address. CADD0_ori is the signal from the pad bonding for the first bit of the chip address. CADD0_ROM is the signal from a first ROM fuse for the first address bit. A second multiplexer MUX2 428 receives two inputs, CADD1_ori and CADD1_ROM for the second bit of the chip address. CADD1_ori is the signal from the pad bonding for the second bit of the chip address. CADD1_ROM is the signal from a second ROM fuse for the second address bit. If CADD_SEL is low, corresponding to an unprogrammed selection ROM fuse for the programmable device select circuitry, the original chip address is provided from the multiplexers. MUX1 provides an output CADD0 for the first bit of the chip address from the pad bonding (CADD0_ori) and MUX2 provides an output CADD1 for the second bit of the chip address from the pad bonding (CADD2_ori). If CADD_SEL is high, corresponding to a programmed selection ROM fuse, the programmed chip address from each of the ROM fuses is provided. MUX1 provides the CADD0_ROM value from the first address ROM fuse on output CADD0 and MUX2 provides the CADD1_ROM value from the second address ROM fuse on output CADD1.

The exemplary embodiment of FIGS. 6-8 utilizes a two-bit address. Accordingly, the multiplexers receive two inputs and two ROM fuses are used for a replacement chip address. If more bits are utilized for a chip address, additional ROM fuses can be used for the additional bits of the address.

It is noted that the programmable chip address may be used independently of the programmable chip enable. For instance, package level testing may reveal that a particular chip is better or has better performance characteristics than other chips. If chip0 of the package is required or desired to be "cleaner" or a better performing chip, select chips can be re-addressed. For instance, if chip 3 has particularly good characteristics, its address may be swapped with chip0's address to put the better chip at the head of the array. In such a case, no chips are disabled.

As already described, some memory systems may include multiple packages. For example, a memory card may contain two or more memory packages. FIG. 9 is a table illustrating another exemplary embodiment for readdressing select memory die to provide a continuous address range. In FIG. 9, two memory packages are being combined to form a larger memory package (e.g., memory card). Each package contains four memory array die. Each of the combined memory package combinations include at least one defective die. By combining two packages, each with defective die, a single good four-die package is provided.

If chip 3 of the first package is bad, and chips 0, 1, and 2 of the second package are bad, the two packages can be combined to form a memory package have a continuous address range made up of four memory die. Chip 3 from the first package and chips 0, 1, and 2 from the second package can be isolated as described above. Chip 3 from the second package is then reconfigured with the address of chip 3 from the first package. Some embodiments utilize separate package addresses or specific bits for the package and also internal die addresses. In this case, reconfiguring chip 3 of package 2 may only require reconfiguring the bits to designate package 1. In other cases, a more complete re-addressing may be used.

Figure 10:
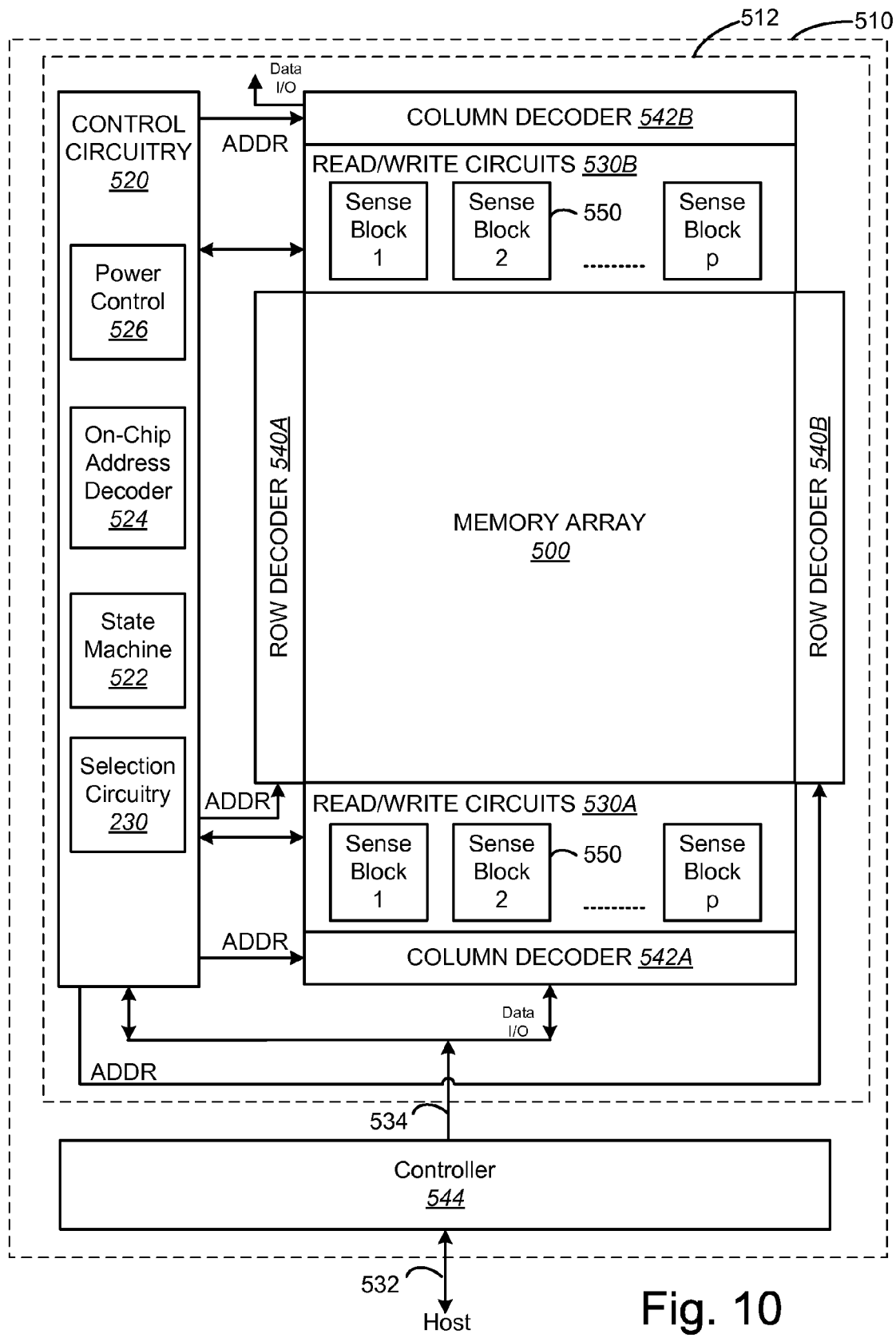
FIG. 10 is a block diagram of a non-volatile memory system.

FIG. 10 is another view of a non-volatile memory system such as that depicted in FIG. 3, showing additional components as may be included in some implementations. Memory device 510 includes one or more memory die or chips 512. Memory die 512 includes a two-dimensional array of memory cells 500, control circuitry 520, and read/write circuits 530A and 530B. In one embodiment, access to the memory array 500 by the various peripheral circuits is implemented in a symmetric fashion, on opposite sides of the array, so that the densities of access lines and circuitry on each side are reduced by half. The read/write circuits 530A and 530B include multiple sense blocks 550 which allow a page of memory cells to be read or programmed in parallel. The memory array 500 is addressable by word lines via row decoders 540A and 540B and by bit lines via column decoders 542A and 542B. In a typical embodiment a controller 544 is included in the same memory device 510 (e.g., a removable storage card or package) as the one or more memory die 512. Commands and data are transferred between the host and controller 544 via lines 532 and between the controller and the one or more memory die 512 via lines 534 which can be device bus 220.

The control circuitry 520 cooperates with the read/write circuits 530A and 530B to perform memory operations on the memory array 500. The control circuitry 520 includes a state machine 522, an on-chip address decoder 524 and a power control module 526. The state machine 522 provides chip-level control of memory operations. The on-chip address decoder 524 provides an address interface between that used by the host or a memory controller to the hardware address used by the decoders 540A, 540B, 542A, and 542B. The power control module 526 controls the power and voltages supplied to the word lines and bit lines during memory operations.

Selection circuitry 230 is part of control circuitry 520 in one embodiment. The control circuitry can form a part of the state machine or can be a stand alone circuit component. As such, the programmable circuitry 240 and 242 can be included in the control circuitry and state machine as well. The control circuitry may or may not house the programmable fuse elements. For instance, dedicated ROM fuses can be provided within the control circuitry in some instances. In other cases, the actual memory array 500 can be used for the programmable elements, thus dividing the programmable circuitry between control circuitry 520 and the array.

Memory cell array 500 is organized as a NAND flash memory array in one embodiment. FIG. 11 is a top view showing an exemplary NAND string 600. FIG. 1121 is an equivalent circuit thereof. The NAND string depicted in FIGS. 11 and 12 includes transistors, 610, 612, 614, and 616, in series between a first select gate 612 and a second select gate 622. In one embodiment, transistors 610, 612, 614, and 616 each form an individual memory cell of the NAND string. In other embodiments, the memory cells of a NAND string may include multiple transistors or may be different than that depicted in FIGS. 11 and 12. The discussion herein is not limited to any particular number of memory cells in a NAND string. Select gate 612 connects the NAND string to bit line 626. Select gate 622 connects the NAND string to a common source line 628. Select gate 612 is controlled by applying the appropriate voltages to control gate 620CG via select line SGD and select gate 622 is controlled by applying the appropriate voltages to control gate 622CG via select line SGS. Each of the transistors has a control gate and a floating gate. Transistor 610 includes control gate 610CG and floating gate 610FG. Transistor 612 includes control gate 612CG and floating gate 612FG. Transistor 614 includes control gate 614CG and floating gate 614FG. Transistor 616 includes control gate 616CG and floating gate 616FG. Control gate 610CG is connected to word line WL3, control gate 612CG is connected to word line WL2, control gate 614CG is connected to word line WL1, and control gate 616CG is connected to word line WL0.

Figure 13:
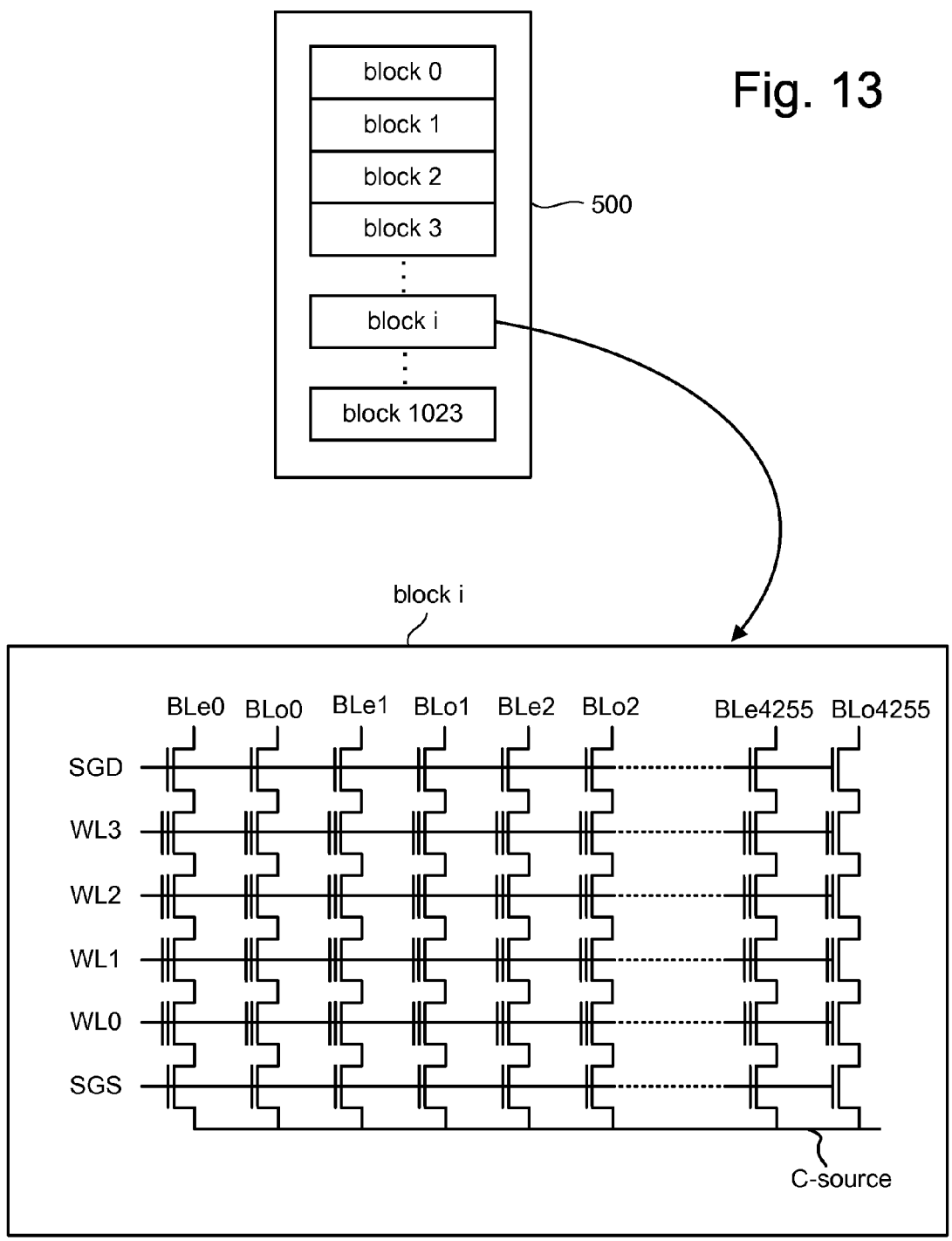
FIG. 13 depicts an exemplary organization of a memory array.

As one example shown in FIG. 13, a NAND flash EEPROM is described that is partitioned into 1,024 blocks. Each block of memory cells includes a set of bit lines forming columns and a set of word lines forming rows. Each block is typically divided into a number of pages. A page is typically a minimum unit of programming or reading, although more than one page may be programmed or read in a single operation. In another embodiment, the individual pages may be divided into segments and the segments may contain the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than those of the user data to which they pertain. A sector of user data is typically 512 bytes, corresponding to the size of a sector commonly used in magnetic disk drives. Overhead data is typically an additional 16-20 bytes. A large number of pages form a block, anywhere from 8 pages, for example, up to 32, 64 or more pages. In some embodiments, a row of NAND strings comprises a block.

FIG. 13 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor or gate (connected to select gate drain line SGD), and another terminal is connected to c-source via a second select transistor (connected to select gate source line SGS). The data stored in each block can be simultaneously erased. In each block of the example in FIG. 13 there are 8,512 columns that are divided into even columns and odd columns. The bit lines are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. Other sized blocks and pages can also be used with embodiments.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

When programming a memory cell in one example, the drain and the p-well receive 0V while the control gate receives a series of programming pulses with increasing magnitudes. In one embodiment, the magnitudes of the pulses in the series range from 12V to 24V. In other embodiments, the range of pulses in the series can be different, for example, having a starting level of higher than 12V. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to $V_{DD}$ (e.g., 1.8V-3.3V) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 14:
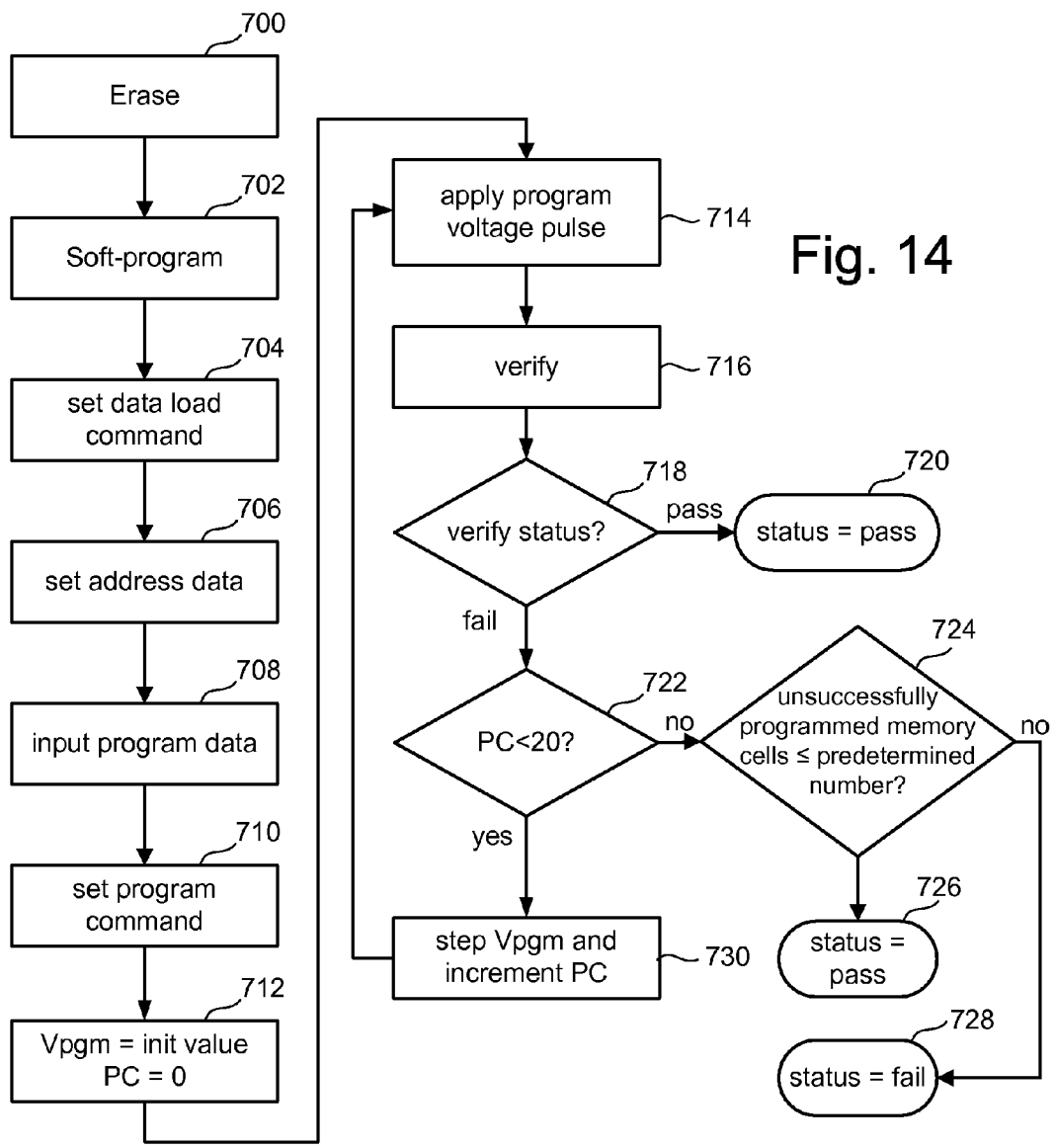
FIG. 14 is a flowchart describing a method of programming non-volatile memory.

FIG. 14 is a flow chart describing one embodiment of a method for programming non-volatile memory. The memory cells to be programmed are erased at step 700. Step 700 can include erasing more memory cells than those to be programmed (e.g., in blocks or other units). At step 702, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 704, a "data load" command is issued by controller 544 and input to control circuitry 520, allowing data to be input to a data input/output buffer. The input data is recognized as a command and latched by state machine 522 via a command latch signal, not illustrated, input to control circuitry 520. At step 706, address data designating the page address is input to row controllers or decoders 540A and 540B from the controller or host. The input data is recognized as the page address and latched via state machine 522, affected by the address latch signal input to the control circuitry. At step 708, a page of program data for the addressed page is input to a data input/output buffer for programming. For example, 532 bytes of data could be input in one embodiment. That data is latched in the appropriate registers for the selected bit lines. In some embodiments, the data is also latched in a second register for the selected bit lines to be used for verify operations. At step 710, a "program" command is issued by the controller and input to the data input/output buffer. The command is latched by state machine 522 via the command latch signal input to the control circuitry.

Triggered by the "program" command, the data latched in step 708 will be programmed into the selected memory cells controlled by state machine 522 using a stepped pulse program voltage signal applied to the appropriate word line. At step 712, $V_{PGM}$, the programming pulse voltage level applied to the selected word line, is initialized to the starting pulse (e.g., 12V) and a program counter PC maintained by state machine 522 is initialized at 0. At step 714, the first $V_{PGM}$ pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming.

At step 716, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 718, it is checked whether all of the data latches are storing logic "1." If so, the programming process is complete and successful because all selected memory cells were programmed and verified to their target states. A status of "PASS" is reported at step 720. Note that in some embodiments, at step 718, not all data latches have to store a logic "1." It can be sufficient if at least a predetermined number of data latches store a logic "1." Data latches that still store a logic "0" are associated with cells that are not yet programmed (slow programming cells) or with defective cells. A limited number of insufficiently programmed cells or defective cells can be tolerated as during subsequent read operations, error correction (ECC) can be applied to correct the corrupted data associated with the slow programming or defective memory cells.

If, at step 718, it is determined that not all of the data latches are storing logic "1," then the programming process continues. At step 722, the program counter PC is checked against a program limit value. One example of a program limit value is 20, however, other values can be used. If the program counter PC is not less than 20, then it is determined at step 724 whether the number of cells that have not been successfully programmed is equal to or less than a predetermined number. If the number of unsuccessfully programmed bits is equal to or less than the predetermined number, then the programming process is flagged as passed and a status of pass is reported at step 726. The bits that are not successfully programmed can be corrected using error correction during the read process. If however, the number of unsuccessfully programmed bits is greater than the predetermined number, the program process is flagged as failed and a status of fail is reported at step 728. If the program counter PC is less than 20, then the $V_{PGM}$ level is increased by the step size and the program counter PC is incremented at step 730. After step 730, the process loops back to step 714 to apply the next $V_{PGM}$ pulse.

The flowchart of FIG. 14 depicts a single-pass programming method as can be applied for binary storage. In a two-pass programming method as can be applied for multi-level storage, for example, multiple programming or verification steps may be used in a single iteration of the flowchart. Steps 712-730 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 15:
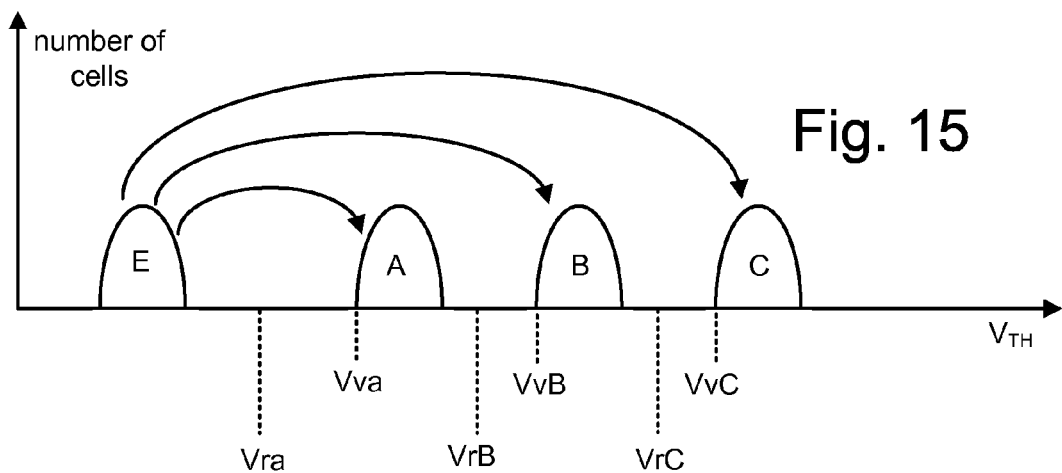
FIG. 15 is a graph depicting an exemplary distribution of threshold voltages for an array of memory cells and a technique for full-sequence programming.

At the end of a successful program process, the threshold voltages of the memory cells should be within one or more distributions of threshold voltages for programmed memory cells or within a distribution of threshold voltages for erased memory cells, as appropriate. FIG. 15 illustrates threshold voltage distributions for the memory cell array when each memory cell stores two bits of data. FIG. 15 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 15 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 15 shows four states, the present invention can also be used with other multi-state structures including those that include more or less than four states.

FIG. 15 also shows three read reference voltages, Vra, Vrb and Vrc, for reading data from memory cells. By testing whether the threshold voltage of a given memory cell is above or below Vra, Vrb and Vrc, the system can determine what state the memory cell is in. FIG. 15 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment as depicted in FIG. 15, known as full sequence programming, memory cells can be programmed from the erase state E directly to any of the programmed states A, B or C. For example, a population of memory cells to be programmed may first be erased so that all memory cells in the population are in erased state E. The process depicted in FIG. 15, will then be used to program memory cells directly into states A, B or C. While some memory cells are being programmed from state E to state A, other memory cells are being programmed from state E to state B and/or from state E to state C. In such embodiments, both bits coded for a particular memory state of a memory cell can be regarded as part of a single page of data.

Figure 16:
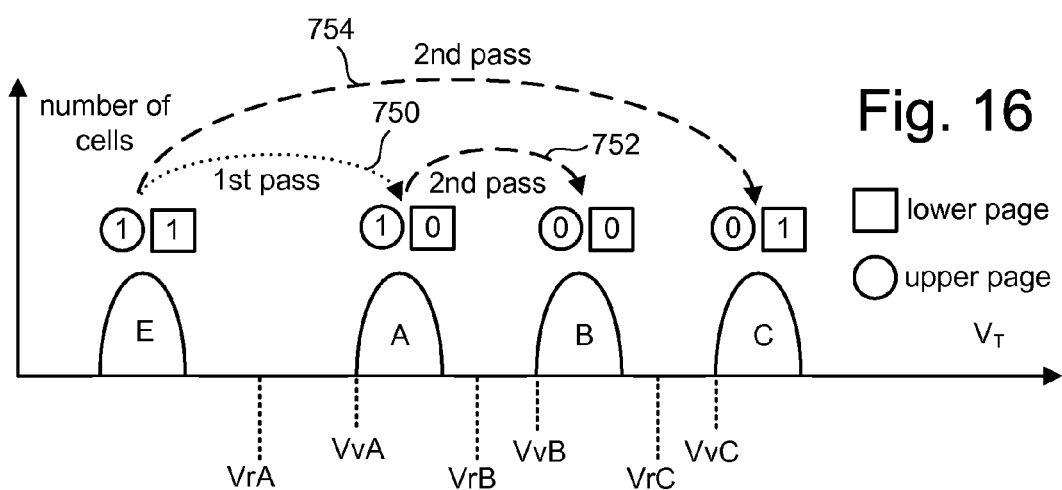
FIG. 16 is a graph depicting an exemplary distribution of threshold voltages for an array of memory cells and a technique for two-pass programming when each memory cell stores data for two pages.

FIG. 16 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 750. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 754. If the cell had been programmed into state A as a result of the first programming pass, then the memory cell is further programmed in the second pass so that the threshold voltage is increased to be within state B, as depicted by arrow 752. The result of the second pass is to program the cell into the state designated to store a logic "0" for the upper page without changing the data for the lower page. There are many ways to measure the conduction current of a memory cell during a read or verify operation. In the above example, the conduction current of the selected memory cell allows (or fails to allow) the NAND string that included the selected memory cell to discharge the bit line. The voltage on the bit line is measured after a period of time to determine whether it has been discharged or not. In another example, the conduction current of a memory cell is measured by the rate it discharges a dedicated capacitor in the sense amplifier.

Figure 17:
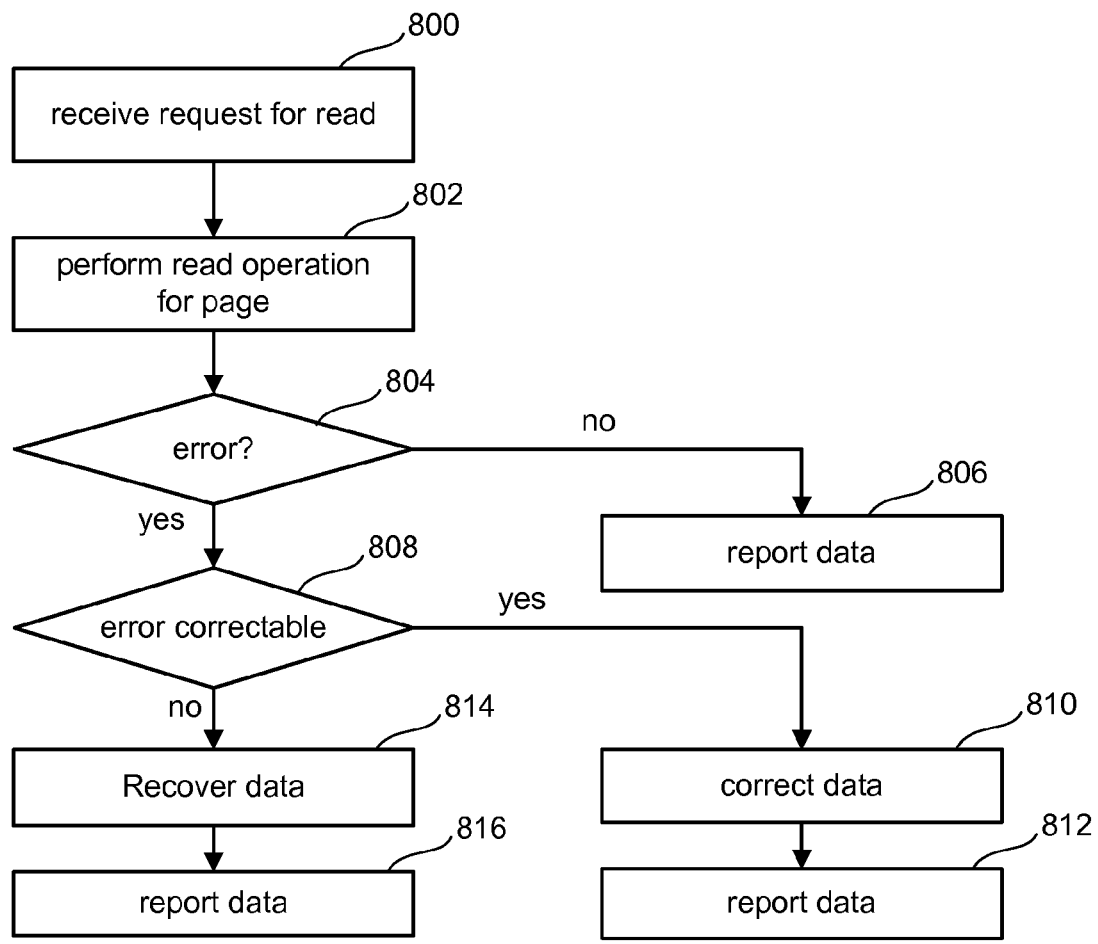
FIG. 17 is a flowchart of a method for reading non-volatile memory.

FIG. 17 is a flow chart describing one embodiment for reading data from non-volatile memory cells. FIG. 17 provides the read process at the system level. At step 802, a read operation is performed for a particular page in response to a request to read data received at step 800. In one embodiment, when data for a page is programmed, the system will also create Error Correction Codes (ECCs) and write those ECCs with the page of data. ECC technologies are well known in the art. The ECC process used can include any suitable ECC process known in the art. When reading data from a page, the ECCs will be used to determine whether there are any errors in the data (step 804). The ECC process can be performed on the controller, the state machine or elsewhere in the system. If there are no errors in the data, the data is reported to the user at step 806. If an error is found at step 804, it is determined whether the error is correctable at step 808. The error may be due to the floating gate to floating gate coupling effect or possibly to other physical mechanisms. Various ECC methods have the ability to correct a predetermined number of errors in a set of data. If the ECC process can correct the data, then the ECC process is used to correct that data at step 810 and the data, as corrected, is reported to the user in step 812. If the data is not correctable by the ECC process, a data recovery process is performed in step 814. In some embodiments, an ECC process will be performed after step 814. After the data is recovered, that data is reported at step 816. Note that the process of FIG. 16 can be used with data programmed using all bit line programming or odd/even bit line programming.

Figure 18:
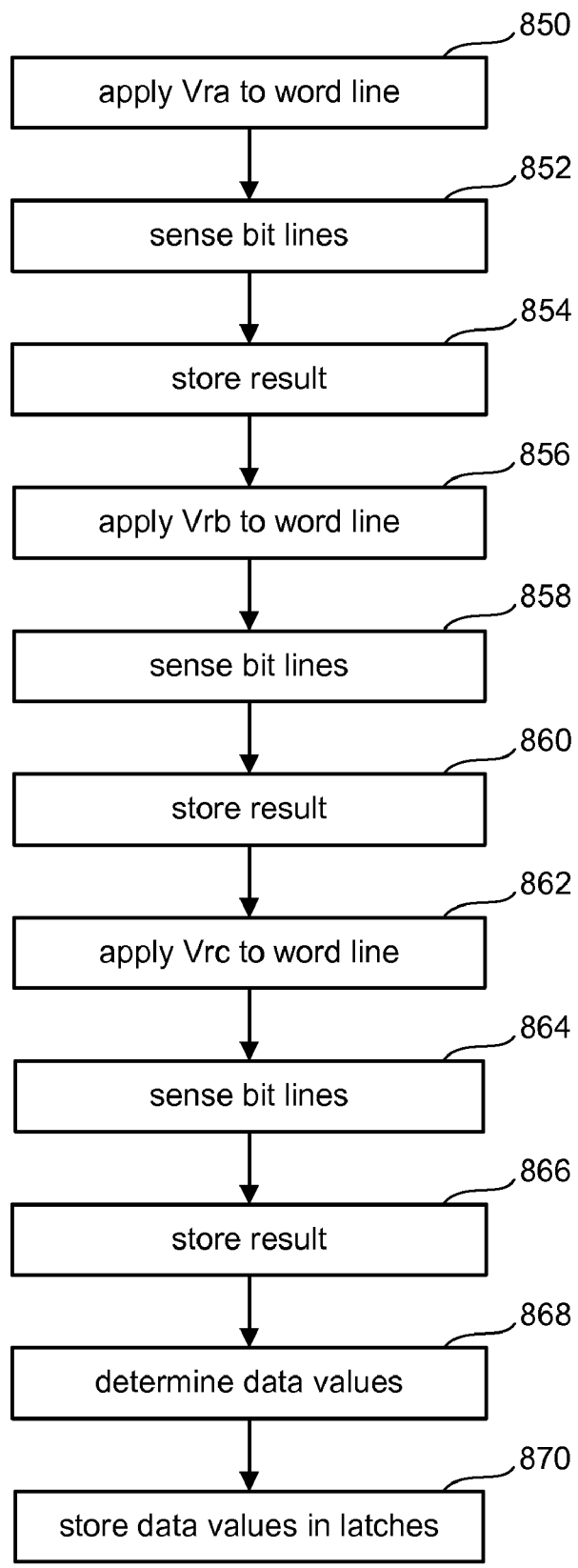
FIG. 18 is a flowchart of a method for reading a page of data from non-volatile memory.

FIG. 18 is a flow chart describing one embodiment of a process for performing a read operation for a page. The process of FIG. 18 can be performed for a page that encompasses all bit lines of a block, only odd bit lines of a block, only even bit lines of a block, or other subsets of bit lines of a block. In step 850, read reference voltage Vra is applied to the appropriate word line associated with the page. In step 852 the bit lines associated with the page are sensed to determine whether the addressed memory cells conduct or do not conduct based on the application of Vra to their control gates. Bit lines that conduct indicate that the memory cells were turned on; therefore, the threshold voltages of those memory cells are below Vra (e.g., in state E). In step 854 the result of the sensing for the bit lines is stored in the appropriate latches for those bit lines. In step 856, read reference voltage Vrb is applied to the word lines associated with the page being read. In step 858, the bit lines are sensed as described above. In step 860, the results are stored in the appropriate latches for the bit lines. In step 862, read reference voltage Vrc is applied to the word lines associated with the page. In step 864, the bit lines are sensed to determine which memory cells conduct, as described above. In step 866, the results from the sensing step are stored in the appropriate latches for the bit lines. In step 868, the data values for each bit line are determined. For example, if a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In other embodiments, sensing the various levels (Vra, Vrb, and Vrc) may occur in different orders.

Different numbers of reference read voltages may need to be applied in various embodiments based on the coding and/or architecture employed. For example, when an upper page/lower page architecture is employed, an upper page read may be accomplished simply by using the Vrb read reference voltage level to determine whether a memory cell is in one of states E and A (upper page bit=1) or in one of states B and C (upper page bit=0). A lower page read may be accomplished by using the Vra and Vrc read reference voltage levels to determine whether a memory cell is in one of states E and C (lower page bit=1) or one of states A and B (lower page bit=0).

Although NAND type flash memory has been principally described for exemplary purposes, the present disclosure is not so limited and has application to numerous types of integrated circuits. In principle, embodiments can be used in any type of circuit including addressable die. Other embodiments may include NOR type flash memory and volatile memories such as SRAM and DRAM. Moreover, the foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory system, comprising:
a plurality of non-volatile memory chips, each including a plurality of non-volatile storage elements and one or more chip enable pins, said one or more chip enable pins of each memory chip are coupled to a common line;
a controller in communication with said common line;
a selection circuit on each memory chip that is responsive to a chip enable signal provided by said controller on said common line, each selection circuit enabling a corresponding memory chip in response to said chip enable signal; and
a set of one or more programmable circuits on each chip, said set of programmable circuits is in communication with a chip enable pin and a selection circuit of a corresponding memory chip, said set of programmable circuits is configurable after packaging said non-volatile memory system to isolate a corresponding memory chip from being enabled in response to said chip enable signal.

2. The non-volatile memory system of claim 1, wherein:
said set of programmable circuits isolates said corresponding memory chip by overriding said chip enable signal before reaching said selection circuit of said corresponding memory chip.

3. The non-volatile memory system of claim 1, wherein:
said set of programmable circuits isolates said corresponding memory chip by providing a substantially constant bias to said selection circuit from said one or more chip enable pins independent of said chip enable signal.

4. The non-volatile memory system of claim 1, wherein:
each memory chip includes one or more device select pins coupled to a set of one or more pads for said each chip, said set of pads for said each chip have a predetermined configuration to define a unique address for said each chip;
said set of one or more programmable circuits on each chip is a first set of one or more programmable circuits; and
each chip further includes a second set of one or more programmable circuits in communication with said one or more device select pins and said selection circuit for said each chip, said second set of one or more programmable circuits for each memory chip is configurable after packaging said non-volatile memory system to define a different address for said each memory chip.

5. The non-volatile memory system of claim 4, wherein:
said plurality of memory chips includes a defective memory chip and a first non-defective memory chip;
said first set of one or more programmable circuits for said defective chip is configured to isolate said defective memory chip from being enabled in response to said chip enable signal; and
said second set of one or more programmable circuits for said first non-defective memory chip is configured to replace said unique address of said first non-defective memory chip with a different address.

6. The non-volatile memory system of claim 5, wherein:
said different address for said first non-defective memory chip is said unique address of said defective memory chip.

7. The non-volatile memory system of claim 4, wherein:
said second set of one or more programmable circuits for a particular memory chip is configured to define a different address by storing said different address, said different address is provided to said selection circuit for said particular memory chip in place of said unique address defined by said predetermined configuration of said set of pads for said particular memory chip.

8. The non-volatile memory system of claim 7, wherein:
said first set of one or more programmable circuits are one or more fuses.

9. The non-volatile memory system of claim 8, wherein:
said one or more fuses include at least one of an anti-fuse, a laser fuse, and an electrically blowable fuse.

10. A non-volatile memory system, comprising:
a plurality of non-volatile memory chips, each including a plurality of non-volatile storage elements and one or more device select pins;
a set of pads for each memory chip, each set of pads coupled to said one or more device select pins for a corresponding memory chip and having a predetermined configuration to define a unique address for said corresponding memory chip;
a controller in communication with each of said memory chips;
a selection circuit on each memory chip, each selection circuit coupled to said one or more device select pins to select a corresponding memory chip when an address received from said controller matches said unique address defined by said predetermined configuration of said set of pads; and
a set of one or more programmable circuits on each chip, each coupled to said one or more device select pins and said selection circuit of a corresponding memory chip, each configurable to replace said unique address of said corresponding memory chip by providing a different address to said selection circuit for said corresponding memory chip after said set of pads for said corresponding memory chip has been configured to said predetermined configuration.

11. The non-volatile memory system of claim 10, wherein:
each of said memory chips includes a chip enable pin in communication with said selection circuit thereon, each chip enable pin is coupled to a common line and responsive to a common chip select signal;
said controller is coupled to said common line to provide said common chip enable signal thereon; and
said selection circuit on each memory chip enables said corresponding memory chip when said chip select signal is received.

12. The non-volatile memory system of claim 11, wherein said set of one or more programmable circuits on each chip is a first set of one or more programmable circuits, said non-volatile memory system further comprising:
a second set of one or more programmable circuits on each chip, each second set of one or more programmable circuits is coupled to said chip select pin on a corresponding memory chip, said second set of one or more programmable circuits is configurable after packaging said non-volatile memory system to override said chip select signal.

13. A non-volatile memory system, comprising:
a plurality of non-volatile memory chips having a chip enable pin, one or more device select pins, and a non-volatile memory array, said plurality of non-volatile memory chips includes a defective memory chip and a first non-defective memory chip;
a set of pads coupled to said one or more device select pins of each memory chip, each set of pads having a predetermined configuration defining a unique address for each memory chip;
a controller in communication with said chip enable pin of each memory chip to provide a chip enable signal thereto;
a selection circuit on each memory chip in communication with said chip enable pin, said one or more device select pins, and said controller, each selection circuit enables its corresponding memory chip in response to said chip enable signal, each selection circuit selects its corresponding memory chip in response to an address received from said controller that matches said unique address defined by said predetermined configuration of said set of pads for said corresponding memory chip;
a first programmable circuit on said defective memory chip, said first programmable circuit is configured after packaging said non-volatile memory system to disable said defective memory chip from being enabled in response to said chip enable signal provided by said controller; and
a second programmable circuit on said first non-defective memory chip, said second programmable circuit is configured after packaging said non-volatile memory system to define a different unique address for said first non-defective memory chip.

14. The non-volatile memory system of claim 13, wherein:
said first programmable circuit on said defective memory chip stores a first indication prior to being configured such that said defective memory chip is not disabled;
said first programmable circuit on said defective memory chip is configured to store a second indication and in response to storing said second indication, provides a signal to said selection circuit for said defective memory chip that overrides said chip enable signal received on said chip enable pin.

15. The non-volatile memory system of claim 14, wherein:
said chip enable signal includes a first potential to which said selection circuits are responsive to enable a corresponding memory chip; and
said first programmable circuit on said defective memory chip provides a second potential to said selection circuit of said defective memory chip.

16. The non-volatile memory system of claim 15, wherein:
said first potential is a low potential; and
said second potential is a high potential.

17. The non-volatile memory system of claim 13, wherein:
said first programmable circuit disables said defective memory chip by causing one or more input buffers of said defective memory chip to be disabled.

* * * * *